(12) United States Patent
Enzmann et al.

(10) Patent No.: US 11,031,534 B2
(45) Date of Patent: Jun. 8, 2021

(54) RADIATION-EMITTING SEMICONDUCTOR CHIP

(71) Applicant: OSRAM Opto Semiconductors GmbH, Regensburg (DE)

(72) Inventors: Roland Heinrich Enzmann, Penang (MY); Lorenzo Zini, Regensburg (DE); Christian Müller, Deuerling (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/471,249

(22) PCT Filed: Mar. 1, 2018

(86) PCT No.: PCT/EP2018/055071
§ 371 (c)(1),
(2) Date: Jun. 19, 2019

(87) PCT Pub. No.: WO2018/162323
PCT Pub. Date: Sep. 13, 2018

(65) Prior Publication Data
US 2020/0091387 A1    Mar. 19, 2020

(30) Foreign Application Priority Data

Mar. 7, 2017   (DE) .......................... 102017104735.2

(51) Int. Cl.
*H01L 33/62* (2010.01)
*H01L 29/06* (2006.01)
*H01L 33/02* (2010.01)

(52) U.S. Cl.
CPC .......... *H01L 33/62* (2013.01); *H01L 29/0649* (2013.01); *H01L 33/02* (2013.01)

(58) Field of Classification Search
CPC ..... H01L 33/62; H01L 29/0649; H01L 33/02; H01L 25/167; H01L 33/0004–648
See application file for complete search history.

(56) References Cited

U.S. PATENT DOCUMENTS 6,054,716 A     4/2000 Sonobe et al.
7,928,462 B2    4/2011 Jang et al.
(Continued)

FOREIGN PATENT DOCUMENTS

DE    102008034560 A1    2/2010
DE    102008045653 A1    3/2010
(Continued)

OTHER PUBLICATIONS

"Electronic Compendium MOS Field Effect Transistor (MOS-FET)," downloaded from http://www.elektronik-kompendium.de/sites/bau/0510161.htm, on Jan. 2, 2017, 12 pages including translation.

*Primary Examiner* — Cuong B Nguyen
(74) *Attorney, Agent, or Firm* — Slater Matsil, LLP

(57) ABSTRACT

A radiation emitting semiconductor chip is disclosed. In an embodiment, a radiation-emitting semiconductor chip includes a carrier including a first main surface and a second main surface opposite to the first main surface, an n-doped layer and a p-doped layer forming a pn-junction and a vertical region starting from the first main surface and running parallel to side faces of the carrier, wherein the vertical region is n-doped, p-doped or electrically insulating, and wherein the vertical region extends within a boundary region of the carrier and completely encloses a central volume region of the carrier, an epitaxial semiconductor layer sequence having an active zone configured to generate electromagnetic radiation during operation, the epitaxial semiconductor layer sequence being located at the first main
(Continued)

surface of the carrier and two electrical contacts disposed on a front side of the semiconductor chip.

16 Claims, 2 Drawing Sheets

(56) References Cited

U.S. PATENT DOCUMENTS

| | | | |
|---|---|---|---|
| 8,278,767 | B2 | 10/2012 | Günther et al. |
| 8,710,537 | B2 | 4/2014 | Engl et al. |
| 9,337,407 | B2 * | 5/2016 | Yao ........................ H01L 33/641 |
| 9,704,945 | B2 | 7/2017 | Günther et al. |
| 2011/0057209 | A1 | 3/2011 | Kim |
| 2013/0299841 | A1 | 11/2013 | Ranglack et al. |
| 2014/0374776 | A1 | 12/2014 | Nakasuji et al. |

FOREIGN PATENT DOCUMENTS

| | | |
|---|---|---|
| DE | 202007019433 U1 | 7/2012 |
| DE | 102011011378 A1 | 8/2012 |
| DE | 102013103967 A1 | 11/2013 |

\* cited by examiner

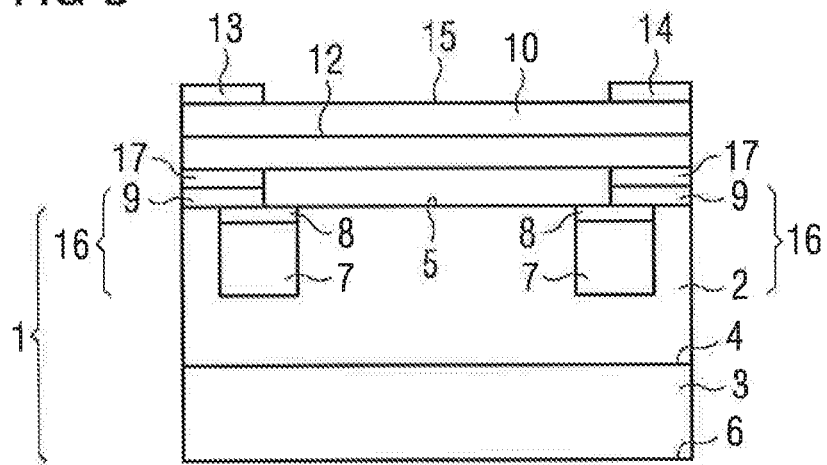
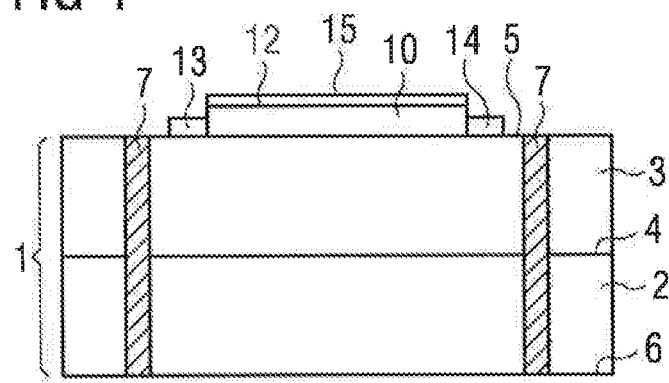
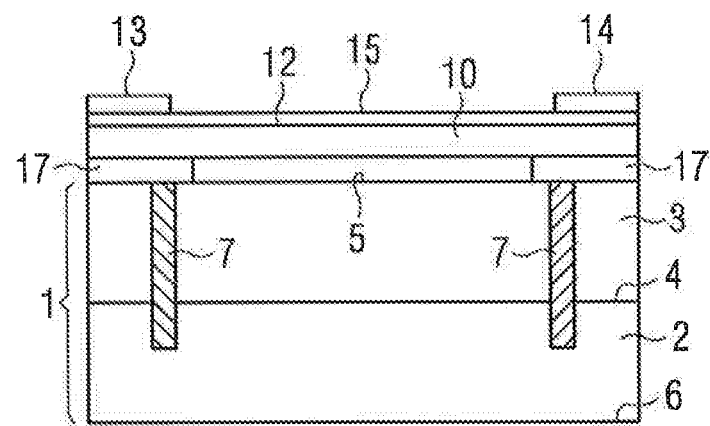

RADIATION-EMITTING SEMICONDUCTOR CHIP

This patent application is a national phase filing under section 371 of PCT/EP2018/055071, filed Mar. 1, 2018, which claims the priority of German patent application 102017104735.2, filed Mar. 7, 2017, each of which is incorporated herein by reference in its entirety.

TECHNICAL FIELD

A radiation-emitting semiconductor chip is provided.

SUMMARY OF THE INVENTION

Embodiments provide a semiconductor chip whose epitaxial semiconductor layer sequence is particularly well electrically isolated from its backside.

According to at least one embodiments of the semiconductor chip, it comprises a carrier with a first main surface and a second main surface opposite to the first main surface. For example, the carrier is a silicon carrier that comprises silicon or consists of silicon. The carrier is configured to mechanically stabilize the epitaxial semiconductor layer sequence, which is usually too thin to be self-supporting. For example, the epitaxial semiconductor layer sequence has a thickness between including 10 micrometers and including 30 micrometers, while the carrier can have a thickness of about 100 micrometers.

According to a further embodiment of the radiation-emitting semiconductor chip, it comprises an epitaxial semiconductor layer sequence with an active zone that generates electromagnetic radiation during operation of the semiconductor chip. The electromagnetic radiation generated in the active zone is preferentially emitted from a radiation exit surface of the semiconductor chip.

The epitaxial semiconductor layer sequence of the semiconductor chip is preferably applied to the first main surface of the carrier. For example, the epitaxial semiconductor layer sequence is applied to the carrier with a joining layer. The joining layer can be an adhesive layer or a solder layer.

Furthermore, the radiation-emitting semiconductor chip comprises two electrical contacts for electrical contacting of the semiconductor chip, which are preferably arranged on a front side of the semiconductor chip. In addition to the electrical contacts, the front side of the semiconductor chip also includes the radiation exit surface. The front side of the semiconductor chip is opposite to a rear side of the semiconductor chip, which usually comprises the second main surface of the carrier and can be intended for mounting the semiconductor chip.

The carrier preferably has an n-doped layer and a p-doped layer that form a pn junction. Usually, a blocking direction of the pn-junction runs from the first main surface of the carrier to the second main surface of the carrier. The pn-junction isolates the epitaxial semiconductor layer sequence at least within a central volume region of the carrier from the backside of the semiconductor chip.

The p-doped layer preferably has a thickness between inclusive 200 nanometers and inclusive 4 micrometers, while the n-doped layer preferably has a thickness of at least 5 micrometers. For example, the n-doped layer has a wafer thickness, for example, of approximately 100 micrometers.

The n-doped layer preferably contains silicon or is formed from silicon in which an n-dopant is incorporated. For example, the n-doped layer contains one of the following materials as an n-dopant: phosphorus, arsenic.

The p-doped layer preferably contains silicon or is formed of silicon, in which a p-dopant is incorporated. For example, the p-doped layer contains Bohr as a p-dopant.

The n-doped layer preferably has a dopant concentration between $10^{12}$ cm$^{-3}$ and $10^{14}$ cm$^{-3}$, inclusive.

The p-doped layer preferably has a dopant concentration between and including $10^{15}$ cm$^{-3}$ and including $10^{18}$ cm$^{-3}$.

According to a further embodiment of the semiconductor chip, the carrier has a vertical region, which extends parallel to side faces of the carrier starting from the first main surface of the carrier and which is n-doped, p-doped or electrically insulating. Preferably, the vertical region is formed within a boundary region of the carrier, wherein however side faces of the carrier are formed by the p-doped layer and the n-doped layer of the carrier. In other words, the vertical region extends preferably entirely except a surface region of the first main surface formed by material of the vertical region within the carrier.

The vertical region preferably has a width between and including 5 micrometers and including 100 micrometers. For example, the vertical region has a width of approximately 10 micrometers. For example, a vertical region that is electrically insulating has an extension in vertical direction between including 5 micrometers and including 100 micrometers. For example, the electrically insulating vertical region has a vertical extension of approximately 10 micrometers.

For example, a vertical region that is doped also has a vertical extension of between including 5 micrometers and including 100 micrometers. For example, the doped vertical region also has an extension in vertical direction of approximately 10 micrometers.

A vertical region having a doping can be created, for example, by ion implantation, while a vertical region which is embodied electrically insulating can be created by an STI process ("shallow trench insulation"). Usually, in an STI process, trenches are first created in the carrier, for example, by wet chemical etching, which are then filled with a dielectric material, such as $SiO_2$, to form the vertical region. Finally, the carrier can be ground back to achieve a desired thickness of the carrier. A vertical region that is insulating can be formed more compact than a vertical region that is doped. In this way, the area of the semiconductor chip can be optimized.

Particularly preferably, the vertical region extends within the boundary region of the carrier and completely encloses the central volume region of the carrier. For example, the vertical region can be ring-shaped. In a plan view of the first main surface of the carrier, the vertical region can form a closed ring along the boundary region of the first main surface of the carrier and, if appropriate, of the second main surface of the carrier. The central volume region of the carrier is particularly preferably formed by the material of the p-doped layer or by the material of the n-doped layer.

For example, the p-doped layer forms the first main surface of the carrier in places and the n-doped layer forms the second main surface of the carrier in places, while the vertical region is n-doped. Alternatively, it is also possible for the n-doped layer to form the first main surface of the carrier in places and the p-doped layer to form the second main surface of the carrier in places. Herein, the vertical region is p-doped. For example, the carrier is formed by the p-doped layer, the n-doped layer and the vertical region.

According to a further embodiment of the radiation-emitting semiconductor chip, the vertical region does not completely penetrate the carrier along the side faces of the carrier. In particular, it is possible that the vertical region does not completely penetrate the pn-junction of the carrier. In other words, the vertical region preferably ends inside the carrier, preferably without piercing the pn-junction of the carrier. In this embodiment, the vertical region is preferably n-doped or p-doped.

According to an embodiment of the semiconductor chip, a surface region of the first main surface of the carrier is formed by the material of the vertical region. If the vertical region is n-doped, the surface region of the first main surface of the carrier is formed by the n-doped material of the vertical region. The remainder of the first main surface of the carrier in this case is preferably formed by the material of the p-doped layer of the carrier.

Alternatively, it is also possible that the vertical region is p-doped so that the surface region of the first main surface of the carrier is formed by the p-doped material of the vertical region. In this case, the remainder of the first main surface of the carrier is preferably formed by the material of the n-doped layer of the carrier.

A dielectric layer is particularly preferred applied on the surface region of the first main surface of the carrier formed by the material of the vertical region. The dielectric layer is preferably in direct contact with the vertical region. Preferably, the dielectric layer completely covers the surface region of the carrier. The remaining first main surface of the carrier, and in particular a central surface region of the first main surface of the carrier, are preferably free of the dielectric layer. The central surface region is limited by the vertical region. The central surface region forms the surface of the central volume region. Also preferred is the dielectric layer in direct contact with the surface region of the carrier.

The dielectric layer may, for example, comprise of one of the following materials or may consist of one of the following materials: $SiO_2$, SiN, AlN, $Al_2O_3$, diamond-like carbon, CaF. The thickness of the dielectric layer is particularly preferred between including 50 nanometers and including 500 nanometers.

It is also possible, that the dielectric layer is introduced into the vertical region starting from the first main surface of the carrier so that the dielectric layer is flush with the surface of the carrier. This can be achieved, for example, by thermal oxidation of the vertical region. This embodiment of the semiconductor chip has the advantage that the first main surface of the carrier is completely flat, making it particularly easy to apply the epitaxial semiconductor layer sequence to the first main surface of the carrier.

Particularly preferably, a metallic layer is applied to the first main surface of the carrier starting from the side faces of the carrier, which partially covers the dielectric layer. Preferably, the metallic layer is in direct contact with the dielectric layer. Particularly preferably, the metallic layer leaves the dielectric layer free in places. The remaining first main surface of the carrier and in particular the central surface region of the carrier are preferably free of the metallic layer.

The metallic layer can, for example, comprise one of the following materials or consists of one of the following materials: Al, Ti, Pt, Au, Ni, Pd, Cu, Cr. Furthermore, it is also possible that the metallic layer is composed as a layer sequence of a plurality of metallic individual layers. For example, a layer sequence Ti/Pt/Au is suitable for such a metallic layer. The metallic layer preferably has a thickness of between 10 nanometers and 200 nanometers, inclusive.

According to a particularly preferred embodiment of the radiation-emitting semiconductor chip, the vertical region is n-doped or p-doped and, together with the dielectric layer and the metallic layer, forms a self-locking MOSFET (MOS-FET short for "metal oxide semiconductor field effect transistor") at the boundary region of the carrier. A self-locking MOSFET is usually of the enrichment type. In this way, leakage currents over the side faces of the carrier can be at least preferably reduced and the backside of the semiconductor chip can be electrically isolated against the epitaxial semiconductor layer sequence in a particularly effective way.

According to a further embodiment of the semiconductor chip, the vertical region is electrically insulating and penetrates the pn-junction of the carrier. Also in this way, leakage currents over the side faces of the carrier can be at least reduced with advantage and the backside of the semiconductor chip can be electrically isolated against the epitaxial semiconductor layer sequence particularly effectively. It is also possible that the vertical region completely penetrates the carrier from the first main surface to the second main surface.

According to an embodiment of the semiconductor chip, an electrically insulating layer is arranged between the first main surface of the carrier and the epitaxial semiconductor layer sequence starting from the side faces of the semiconductor chip, the electrically insulating layer covers the vertical region, also preferably completely. Here, the epitaxial semiconductor layer sequence also covers the vertical region, preferably completely.

For example, the epitaxial semiconductor layer sequence has a cross-sectional area that is equal to the cross-sectional area of the carrier. Side faces of the epitaxial semiconductor layer sequence are preferably flush with the side faces of the carrier. A semiconductor chip in which the epitaxial semiconductor layer sequence has a cross-sectional area corresponding to that of the carrier is usually particularly easy to manufacture. The electrically insulating layer contributes advantageously to the electrical insulation of the epitaxial semiconductor layer sequence from the material arranged under the electrically insulating layer.

In particular when using a metallic layer, which can form a MOSFET with other elements of the semiconductor chip, an electrically insulating layer is preferred. The electrically insulating layer preferably completely covers the metallic layer, while the remainder of the first main surface of the carrier is preferably free of the electrically insulating layer. The electrically insulating layer is preferably in direct contact with the metallic layer. The epitaxial semiconductor layer sequence covers the vertical region, preferably completely.

The electrically insulating layer can comprise one of the following materials or can consists of one of the following materials: $SiO_2$, SiN, AlN, $Al_2O_3$, diamond-like carbon, CaF. The thickness of the electrically insulating layer is particularly preferred between 50 nanometers and 500 nanometers, inclusive.

According to a further embodiment of the semiconductor chip, it is also possible that the epitaxial semiconductor layer sequence is applied only to a central surface region of the first main surface of the carrier, which is limited by the vertical region. The remaining first main surface of the carrier is preferably free of the epitaxial semiconductor layer sequence. In particular, the epitaxial semiconductor layer sequence preferably does not cover the vertical region.

Embodiments of the present semiconductor chip are based on the idea to electrically isolate an epitaxial semiconductor layer sequence of the semiconductor chip by inserting a vertical region into a carrier with a pn-junction particularly well from a backside of the semiconductor chip.

The central volume region of the carrier is preferably formed by the p-doped layer and the n-doped layer, which form the pn junction that electrically isolates the epitaxial semiconductor layer sequence from the backside of the semiconductor chip at least within the central volume region. In order to prevent leakage currents over the side faces of the semiconductor chip, a structuring of the carrier in the boundary region of the carrier is conducted. In particular, radiation-emitting semiconductor chips with good high-current properties and low lead-in resistance, which have comparatively thick metallic lead-in layers, are susceptible to leakage currents across the side faces due to metal impurities generated by the separation process. Consequently, embodiments of this invention are particularly advantageous for such semiconductor chips.

BRIEF DESCRIPTION OF THE DRAWINGS

Further preferred embodiments and developments of the invention result from the exemplary embodiments described in the following in connection with the Figures.

FIGS. 3 to 5 each shows a schematic cross-section of a radiation-emitting semiconductor chip according to an exemplary embodiment.

Equal or similar elements or elements of equal function are designated with the same reference signs in the Figures. The Figures and the proportions of the elements shown in the Figures are not regarded as being shown to scale. Rather, single elements, in particular layers, can be shown exaggerated in magnitude for the sake of better presentation and/or better understanding.

DETAILED DESCRIPTION OF ILLUSTRATIVE EMBODIMENTS

Figure 1:
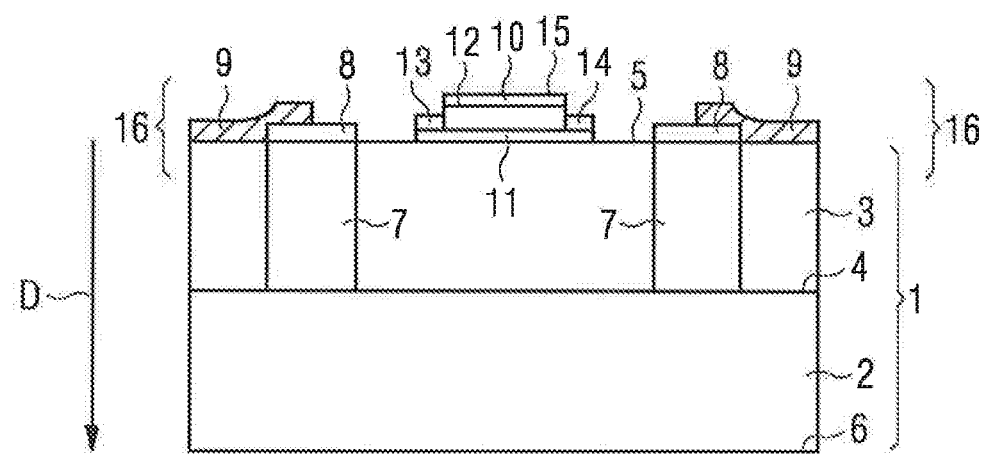
FIG. 1 shows a schematic cross-section of a radiation-emitting semiconductor chip according to a first exemplary embodiment.

The radiation-emitting semiconductor chip according to the exemplary embodiment of FIG. 1 has a carrier 1 with an n-doped layer 2 and a p-doped layer 3. The n-doped layer 2 and the p-doped layer 3 form a pn junction 4. The pn-junction 4 has a blocking direction D which runs from a first main surface 5 of the carrier 1 to a second main surface 6 of the carrier 1, wherein the first main surface 5 is opposite to the second main surface 6.

The p-doped layer 3 forms the first main surface 5 of the carrier 1 in places, while the n-doped layer 2 forms the second main surface 6 of the carrier 1 at least in places. Furthermore, carrier 1 comprises a vertical region 7, which is n-doped in the present case. The vertical region 7 extends, starting from the first main surface 5 of the carrier 1, parallel to the side faces of the carrier 1 through its pn-junction 4.

A dielectric layer 8 is applied to a surface region of the carrier 1 formed by material of the n-doped vertical region 7. The dielectric layer 8 completely covers the surface region and leaves the remaining first main surface 5 of the carrier 1 completely free.

Starting from the side faces of the carrier 1, a metallic layer 9 is applied to the first main surface 5 of the carrier 1, partially covering the dielectric layer 8.

An epitaxial semiconductor layer sequence 10 is applied to a central surface region of the carrier 1 using a joining layer 11. The central surface region of the carrier 1 is limited by the vertical region 7. The boundary region of the first main surface 5, on the other hand, is free of the epitaxial semiconductor layer sequence 10.

The epitaxial semiconductor layer sequence 10 comprises an active zone 12, which generates electromagnetic radiation during operation, and two electrical contacts 13, 14, which are arranged on a front side of the semiconductor chip. The front side of the semiconductor chip comprises a radiation exit surface 15 of the semiconductor chip and is opposite to the second main surface 6 of the carrier 1. The electromagnetic radiation generated during operation in the active zone 12 is emitted from the radiation exit surface 15.

In the exemplary embodiment of FIG. 1, the vertical region 7, together with the dielectric layer 8 and the metallic layer 9 in the boundary region of the carrier 1, forms a self-locking MOSFET 16, which advantageously at least reduces the formation of leakage currents across the side faces of the carrier 1. The central volume region of the carrier 1 is formed by the self-locking pn junction 4, which is formed by the p-doped layer 3 and the n-doped layer 2. In this way, the epitaxial semiconductor layer sequence 10 is particularly well electrically isolated from a backside of the semiconductor chip. The back side of the semiconductor chip is opposite its front side.

Figure 2:
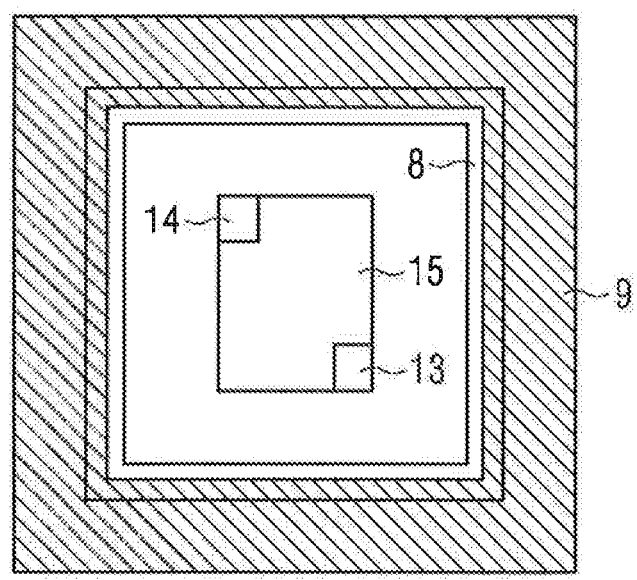
FIG. 2 shows a schematic plan view of the radiation-emitting semiconductor chip according to the exemplary embodiment of FIG. 1.

As can be seen in the plan view of FIG. 2 of the radiation-emitting semiconductor chip according to the exemplary embodiment of FIG. 1, the vertical region 7 forms a closed ring around the central volume region of the carrier in its boundary region.

Like the radiation-emitting semiconductor chip according to FIGS. 1 and 2, the radiation-emitting semiconductor chip according to the exemplary embodiment of FIG. 3 has a vertical region 7 which is n-doped and extends within the p-doped layer 2 of the carrier 1 along its side faces. However, the vertical region 7 does not completely penetrate the pn-junction 4 of the carrier 1. Rather, the vertical region 7 ends within the p-doped layer 2.

Furthermore, starting from the first main surface 5 of the carrier 1, a dielectric layer 8 is introduced into the vertical region 7, which forms a plane surface with the first main surface 5 of the carrier 1. Starting from the side faces of the carrier 1, a metallic layer 9 is applied to the first main surface 5 of the carrier 1, which partially covers the dielectric layer 8 and leaves it free in places. The vertical region 7 together with the dielectric layer 8 and the metallic layer 9 forms a self-locking MOSFET 16 in the boundary region of the carrier 1, which at least reduces leakage currents over the side faces of the carrier 1.

An electrically insulating layer 17, which completely covers the metallic layer 9, is applied to the metallic layer 9. The insulating layer 17 provides electrical insulation between the epitaxial semiconductor layer sequence 10 and the metallic layer 9.

In contrast to the semiconductor chip according to the exemplary embodiment of FIGS. 1 and 2, the epitaxial semiconductor layer sequence 10 of the radiation-emitting semiconductor chip according to the exemplary embodiment of FIG. 3 has a cross-sectional area equal to the cross-sectional area of the carrier 1. The side faces of the epitaxial semiconductor layer sequence are flush with the side faces of the carrier 1.

In contrast to the semiconductor chip according to the exemplary embodiment of FIGS. 1 and 2, the radiation-emitting semiconductor chip of the exemplary embodiment of FIG. 4 has a vertical region 7, which is electrically insulating and completely penetrates the carrier 1 from its first main surface 5 to its second main surface 6. In particular, in this exemplary embodiment, the vertical region 7 pierces the pn-junction 4 of the carrier 1.

The vertical region 7 of the semiconductor chip according to FIG. 4 is formed by silicon dioxide. The epitaxial semiconductor layer sequence 10 with the two front contacts 13, 14 of the radiation-emitting semiconductor chip of FIG. 4 is applied to the first main surface 5 of the carrier 1 within the central surface region bounded by the vertical region 7.

In contrast to the radiation-emitting semiconductor chip according to FIG. 4, the radiation-emitting semiconductor chip according to the exemplary embodiment of FIG. 5 has an electrically insulating vertical region 7, which penetrates the pn-junction 4 of the carrier 1, but does not extend to the second main surface 6 of the carrier 1, but ends inside the n-doped layer 2. Furthermore, in contrast to the radiation-emitting semiconductor chip according to FIG. 4, the epitaxial semiconductor layer sequence 10 has a cross-sectional area substantially corresponding to the cross-sectional area of the carrier 1. To provide an electrical insulation from the vertical region 7, an electrically insulating layer 17 is disposed between the epitaxial semiconductor layer sequence 10 and the first main surface 5 of the carrier 1, completely covering the vertical region 7.

The invention is not limited to the description of the exemplary embodiments to these. Rather, the invention comprises each new feature as well as each combination of features, particularly each combination of features of the patent claims, even if the feature or the combination of features itself is not explicitly given in the patent claims or exemplary embodiments.

The invention claimed is:

1. A radiation-emitting semiconductor chip comprising:
   a carrier comprising:
     a first main surface and a second main surface opposite to the first main surface;
     an n-doped layer and a p-doped layer forming a pn-junction; and
     a vertical region starting from the first main surface and running parallel to side faces of the carrier, wherein the vertical region is n-doped, p-doped or electrically insulating, and wherein the vertical region extends within a boundary region of the carrier and completely encloses a central volume region of the carrier;
   an epitaxial semiconductor layer sequence having an active zone configured to generate electromagnetic radiation during operation, the epitaxial semiconductor layer sequence being located at the first main surface of the carrier; and
   two electrical contacts disposed on a front side of the radiation-emitting semiconductor chip.

2. The radiation-emitting semiconductor chip according to claim 1, wherein the carrier is a silicon carrier.

3. The radiation-emitting semiconductor chip according to claim 1, wherein the vertical region does not completely penetrate the carrier along side faces of the radiation-emitting semiconductor chip.

4. The radiation-emitting semiconductor chip according to claim 1, wherein a surface region of the first main surface of the carrier comprises a material of the vertical region, and wherein a dielectric layer is located at the surface region of the first main surface of the carrier.

5. The radiation-emitting semiconductor chip according to claim 4, further comprising a metallic layer partially covering the dielectric layer and located at the first main surface of the carrier starting from the side faces of the carrier.

6. The radiation-emitting semiconductor chip according to claim 5, wherein the vertical region is n-doped or p-doped and forms together with the dielectric layer and the metallic layer a self-locking MOSFET.

7. The radiation-emitting semiconductor chip according to claim 1, further comprising a dielectric layer in the vertical region starting from the first main surface of the carrier so that the dielectric layer is flush with the first main surface of the carrier.

8. The radiation-emitting semiconductor chip according to claim 7, further comprising a metallic layer partially covering the dielectric layer and located at the first main surface of the carrier starting from the side faces of the carrier.

9. The radiation-emitting semiconductor chip according to claim 8, wherein the vertical region is n-doped or p-doped and forms together with the dielectric layer and the metallic layer a self-locking MOSFET.

10. The radiation-emitting semiconductor chip according to claim 1, wherein the p-doped layer in places forms the first main surface of the carrier and the n-doped layer in places forms the second main surface of the carrier, and wherein the vertical region is n-doped.

11. The radiation-emitting semiconductor chip according claim 1, wherein the n-doped layer in places forms the first main surface of the carrier and the p-doped layer in places forms the second main surface of the carrier, and wherein the vertical region is p-doped.

12. The radiation-emitting semiconductor chip according to claim 1, wherein the vertical region is electrically insulating and penetrates the pn-junction of the carrier.

13. The radiation-emitting semiconductor chip according to claim 1, further comprising an electrically insulating layer covering the vertical region and arranged between the first main surface of the carrier and the epitaxial semiconductor layer sequence starting from the side faces of the radiation-emitting semiconductor chip, wherein the epitaxial semiconductor layer sequence also covers the vertical region.

14. The radiation-emitting semiconductor chip according to claim 13, wherein the vertical region is n-doped or p-doped and together with a dielectric layer and a metallic layer forms a self-locking MOSFET, wherein the electrically insulating layer completely covers the metallic layer, wherein a remaining portion of the first main surface of the carrier is free of the electrically insulating layer, and wherein the epitaxial semiconductor layer sequence also covers the vertical region.

15. The radiation-emitting semiconductor chip according to claim 1, wherein the epitaxial semiconductor layer sequence is located only at a central surface region of the first main surface of the carrier.

16. A radiation-emitting semiconductor chip comprising:
    a carrier comprising:
      a first main surface and a second main surface opposite to the first main surface;
      an n-doped layer and a p-doped layer forming a pn-junction; and
      a vertical region which, starting from the first main surface of the carrier, runs parallel to side faces of the carrier, the vertical region being n-doped, p-doped or electrically insulating;
    an epitaxial semiconductor layer sequence having an active zone configured to generate electromagnetic radiation during operation, the epitaxial semiconductor layer sequence being located at the first main surface of the carrier; and two electrical contacts disposed on a front side of the radiation-emitting semiconductor chip.

\* \* \* \* \*